(12) United States Patent
Hubris et al.

(10) Patent No.: US 10,817,474 B2
(45) Date of Patent: Oct. 27, 2020

(54) ADAPTIVE RATE COMPRESSION HASH PROCESSOR

(71) Applicant: Tidal Systems, Inc., Santa Clara, CA (US)

(72) Inventors: Alexander Hubris, San Jose, CA (US); Yingquan Wu, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 395 days.

(21) Appl. No.: 15/943,227

(22) Filed: Apr. 2, 2018

(65) Prior Publication Data
US 2018/0225298 A1 Aug. 9, 2018

Related U.S. Application Data

(63) Continuation of application No. 14/824,703, filed on Aug. 12, 2015, now Pat. No. 9,934,234.
(Continued)

(51) Int. Cl.
*G06F 16/00* (2019.01)
*G06F 16/174* (2019.01)
*G06F 16/13* (2019.01)
*G06F 16/17* (2019.01)
*H03M 7/30* (2006.01)
*G06F 16/22* (2019.01)

(52) U.S. Cl.
CPC ........ *G06F 16/1744* (2019.01); *G06F 16/137* (2019.01); *G06F 16/1727* (2019.01); *G06F 16/2255* (2019.01); *H03M 7/3086* (2013.01)

(58) Field of Classification Search
CPC .................................................. G06F 16/2255
See application file for complete search history.

(56) References Cited

U.S. PATENT DOCUMENTS

| 4,929,946 | A | 5/1990 | O'Brien et al. |
| 8,766,827 | B1 | 7/2014 | Milne et al. |

(Continued)

FOREIGN PATENT DOCUMENTS

| JP | 04503421 A | 6/1992 |
| JP | 09036747 A | 2/1997 |

OTHER PUBLICATIONS

Deutsch, "Deflate Compressed Data Format Specification version 1.3". IETF. May 1996. p. 1. sec. Abstract. RFC 1951.
(Continued)

*Primary Examiner* — Ajith Jacob
(74) *Attorney, Agent, or Firm* — Brooks, Cameron & Huebsch, PLLC

(57) ABSTRACT

An input file is processed according to hash algorithm that references sets of literals to preceding sets of literals to facilitate copy-offset command generation. Preceding instances are identified by generating a hash of the literal set and looking up a corresponding entry in a hash table. The hash table may be accessed by placing look-up requests in a FIFO buffer. When the FIFO buffer is full, generation of the hash chain is suspended until it is no longer full. When repeated literals are found, generation of the hash chain is likewise suspended. The hash chain is used to generate a command file, such as according to the LZ algorithm. Runs of consecutive literals are replaced by a run-length command. The command file may then be encoded using Huffman encoding.

20 Claims, 7 Drawing Sheets

Related U.S. Application Data

(60) Provisional application No. 62/036,453, filed on Aug. 12, 2014.

(56) References Cited

U.S. PATENT DOCUMENTS

| | | | |
|---|---|---|---|
| 2005/0283711 A1* | 12/2005 | Claseman | G06F 16/9014 |
| | | | 714/759 |
| 2007/0109153 A1 | 5/2007 | Ma et al. | |
| 2007/0168560 A1 | 7/2007 | Alkire | |
| 2010/0182170 A1 | 7/2010 | Ylonen | |
| 2013/0135121 A1 | 5/2013 | Glass et al. | |
| 2014/0104085 A1 | 4/2014 | Cohen | |
| 2014/0114937 A1 | 4/2014 | Chen | |
| 2014/0307737 A1* | 10/2014 | Levy | G06F 16/245 |
| | | | 370/392 |

OTHER PUBLICATIONS

Huffman, "A Method for the Construction of Minimum-Redundancy Codes" Proceedings of the IRE, 1952., pp. 1098-1101.

Ziv, "Compression of Individual Sequences via Variable-Rate Coding". IEEE Transactions on Information Theory, vol. 24, No. 5, Sep. 1978, 7 pp.

Gailly, et al. GZIP: The Data Compression Program, 1993, http://www.gzip.org.

International Search Report and Written Opinion from related international application No. PCT/US2015/044846, dated Nov. 6, 2015, 6 pp.

Notice of Rejection Grounds from related Japanese patent application No. 2017-506990, dated Apr. 10, 2018, 6 pp.

\* cited by examiner

ADAPTIVE RATE COMPRESSION HASH PROCESSOR

RELATED APPLICATIONS

This application is a Continuation of U.S. application Ser. No. 14/824,703, filed Aug. 12, 2015, which issues as U.S. Pat. No. 9,934,234 on Apr. 3, 2018, which claims the benefit of U.S. Provisional Ser. No. 62/036,453, filed Aug. 12, 2014, and entitled Adaptive Rate Compression Hash Processor.

BACKGROUND

Field of the Invention

This invention relates to systems and methods for compressing data.

Background of the Invention

Software compression is very well understood and the source code for programs like GZIP are readily accessible in the public domain. The algorithm to implement compression is relatively complex to do in hardware for high bandwidth application given that the GZIP compression is based on the DEFLATE [2] algorithm and Huffman coding [3]. The idea behind compression is to use copy commands later in a data stream that appears earlier in the data stream. As such all compression implementations require a search history buffer and some type of compare length function to determine the longest length that can be used for the copy command. One method to implement the search matching in the previous history is to implement a hash function which maps the variable length string to fixed value which can be used to compare the data stream being compressed.

FIG. 1 represents a functional hardware block diagram of the compression algorithm for GZip. The input data 102 is hashed by a hash module 104 of a module 108 implementing, for example the LZ7/LZ78 algorithm. The hashed data is compared to generate a copy or literal command by the LZ CMD module 108 per Lempel-Ziv [4] algorithm or comparable algorithm. Once the statistics for the data to be compressed are gathered they are Huffman encoded and then compressed to be sent out as compressed output data 110.

The systems and methods disclosed herein provide an improved method for hashing input data.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
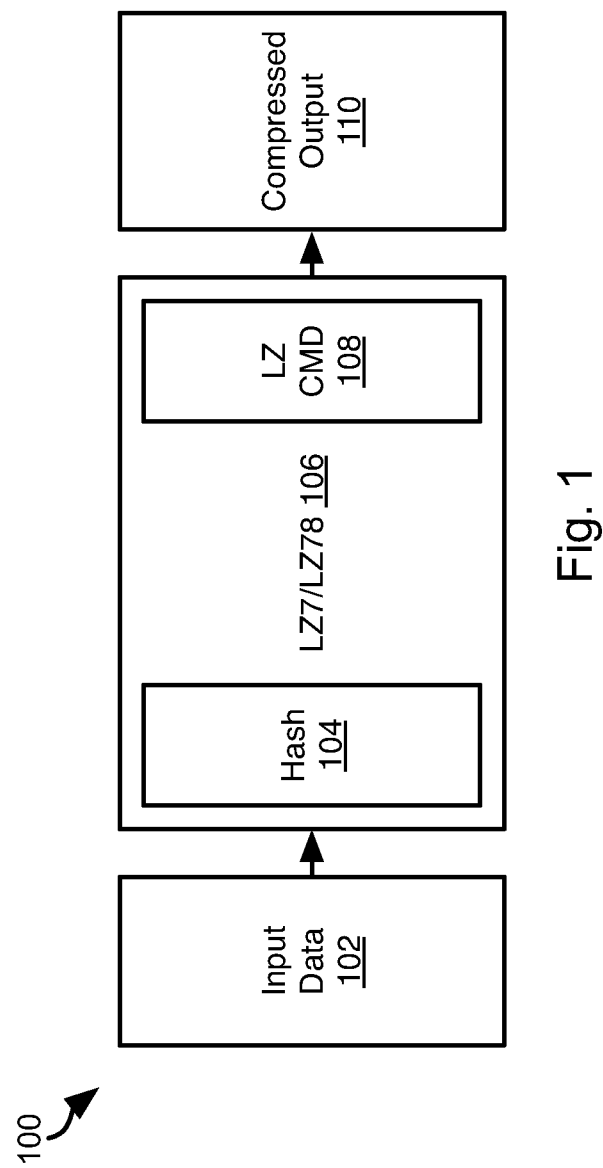
FIG. 1 is a schematic block diagram of components for implementing a compression scheme in accordance with the prior art.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
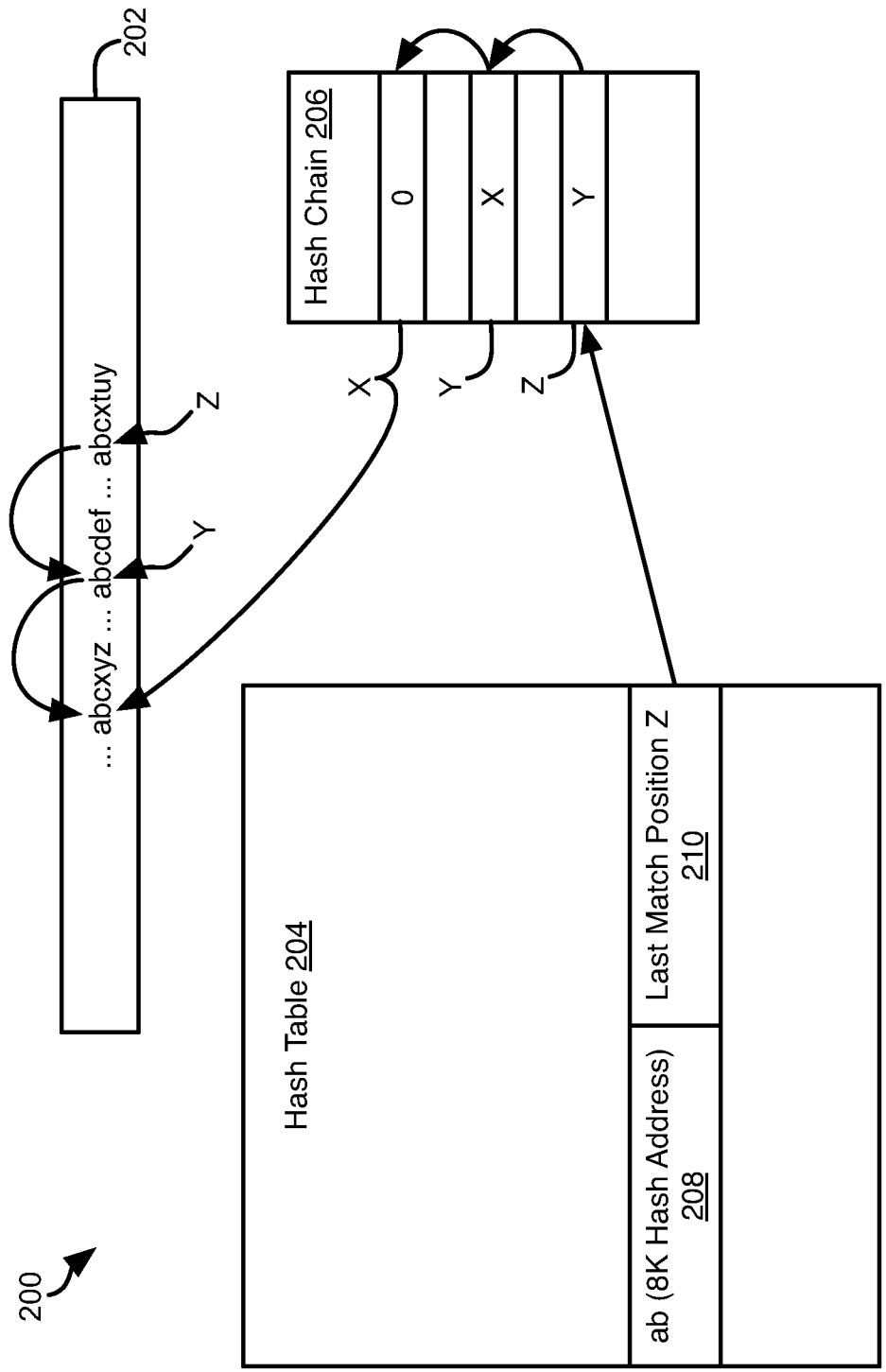
FIG. 2 is a diagram illustrating the generation of a hash and hash chain in accordance with an embodiment of the present invention.
Figure 3:
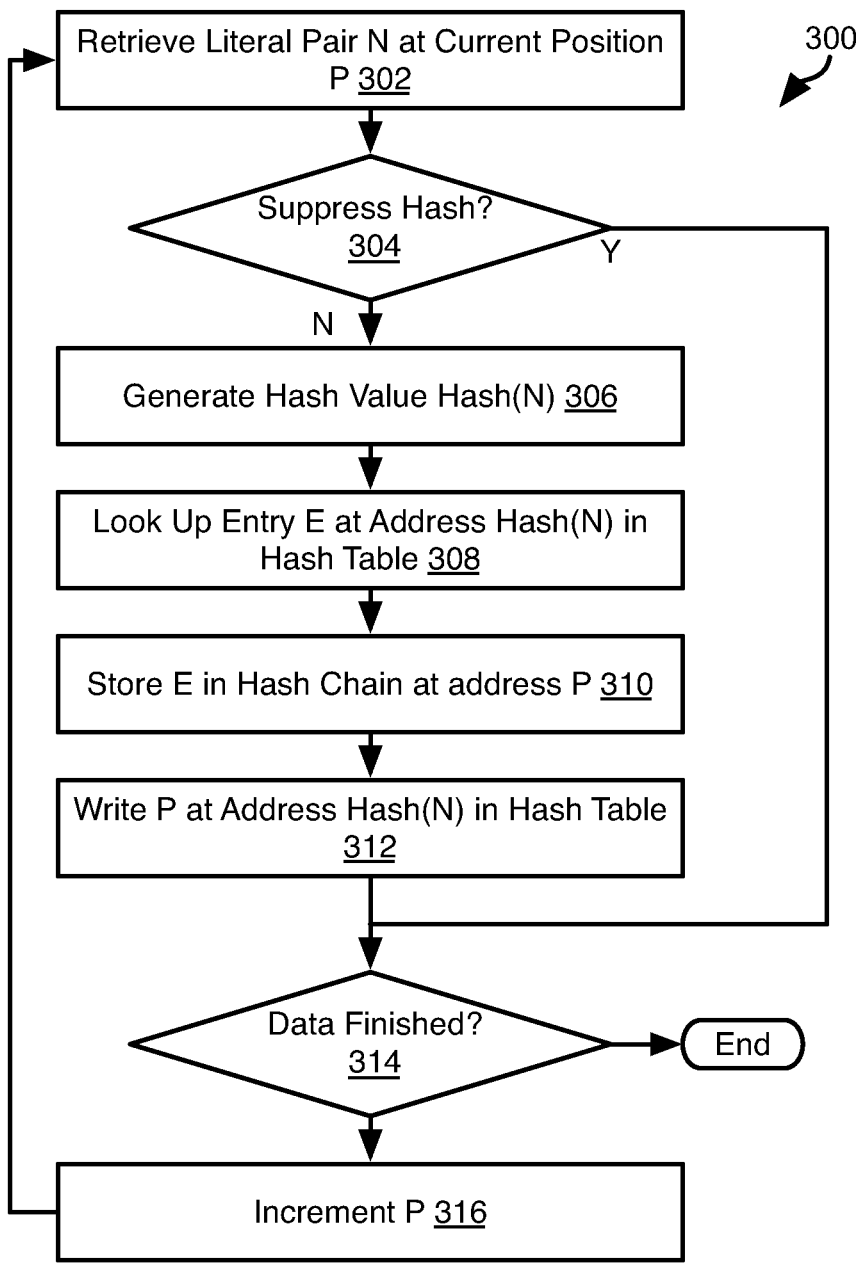
FIG. 3 is a process flow diagram of a method for generating a hash chain in accordance with an embodiment of the present invention.

Referring to FIGS. 2 and 3, a hash 200 is used in order to quickly index most or all the possible references of a file, string, or other data set 202 that is to be compressed later per Lempel-Ziv(LZ) algorithm and other compression derivatives. An example of a hash table 204 and hash chain 206 that may be generated is show in FIG. 2. The populating of the hash table 204 and hash chain 206 may be performed using the method 300 of FIG. 3. A hash table 204 and hash chain 206 as generated according to the methods disclosed herein may be processed to compress the original data set 202 according to any method known in the art, particularly the LZ algorithm.

Figure 4:
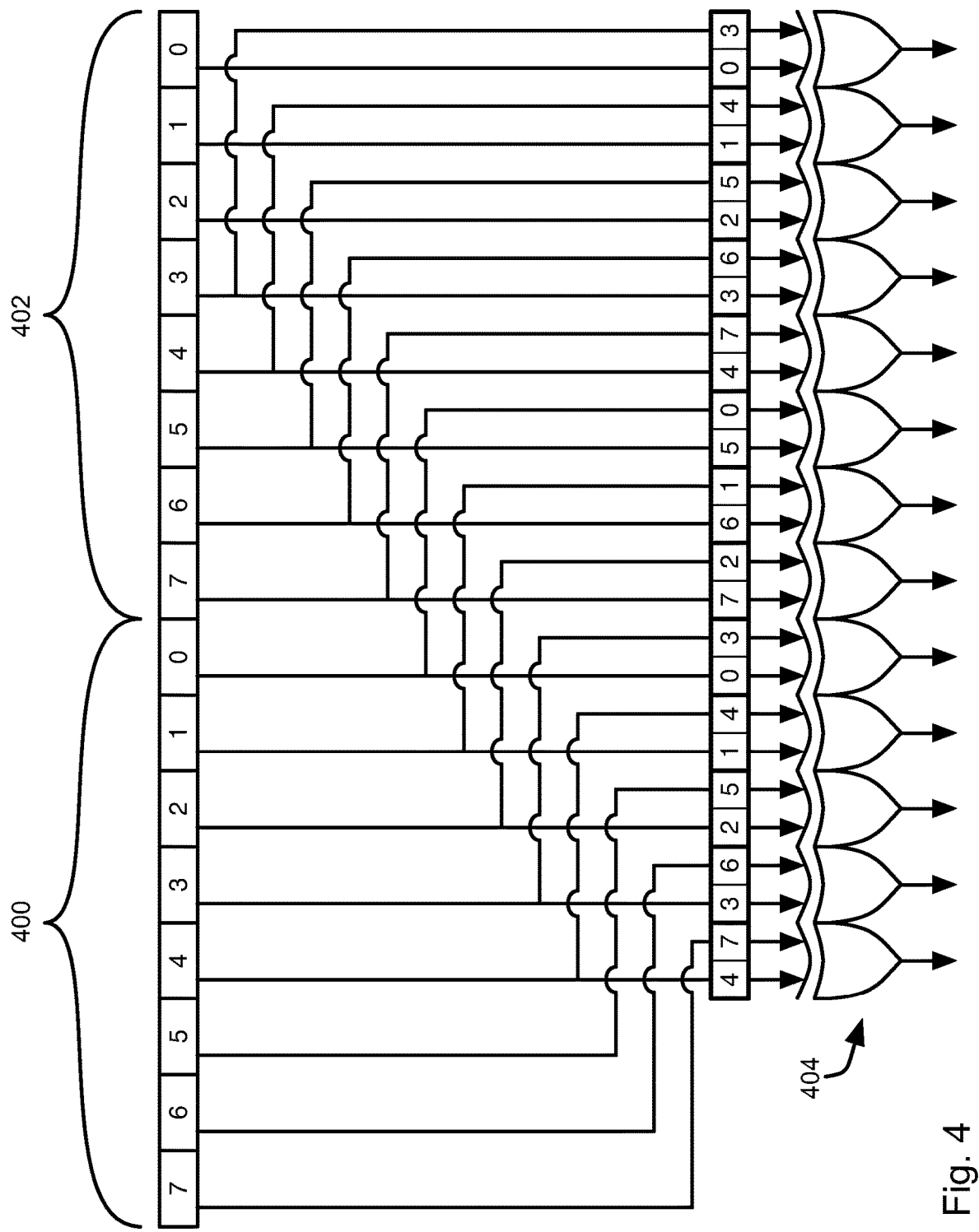
FIG. 4 is a schematic block diagram of a circuit for implementing a hash in accordance with an embodiment of the present invention.

At step 302 a literal pair N at a current position P is retrieved. For the first literal pair P may be equal to zero. In the example of FIG. 2, position P is equal to X and N is equal to 'ab.' The method 300 may include determining 304 whether generating of a hash chain should be suppressed with respect to the literal N. This may include executing the method 600 of FIG. 5. If the hashing is not found 304 to be suppressed, the method 300 may include generating 306 a hash of the literal pair N, i.e. Hash(N), where Hash( ) is a hashing function. An example hashing function and an implementing circuit is shown in FIG. 4.

An entry E in the hash table 204 at address Hash(N) may then be looked up 308. In the example of FIG. 2, the value of E is zero for the first occurrence of the literal pair 'ab.' For example, the hash table 204 may be initialized to zero for each sector or data file processed according to the method 300.

The value of E may then be stored 310 in hash chain 206 at the position P. In the example of FIG. 2, the value 0 is stored at position X in the hash chain 206 for the first instance of 'ab.' The value of P may also be written 312 at address Hash(N) in the hash table 204. In the illustrated example, the value of X may be written at address Hash('ab') in the hash table 204.

If position P is the location of the last literal or literal pair, then the data file will be found 314 to be finished and the method will end. Otherwise, the value of P will be incremented to point to the next literal, i.e. P=P+1 literal position, and the method will continue at step 302. For example, for the string 'abcd,' the literal pair 'ab' will be processed first at P=0. At P=1, the literal pair 'bc' will be processed, and so on. Steps 314 and 316 may be executed even when the hash is determined 304 to be suppressed as shown in FIG. 3.

In the example of FIG. 2, the next iteration of steps 304-312 will result in the value of X being retrieved from address Hash('ab') in response to detecting the next occurrence of 'ab' at position Y. Accordingly, X is written at location Y in the hash chain 206 and Y is written at address Hash('ab') in the hash table.

In response to detecting the next occurrence of 'ab' at position Z, the value Y is retrieved from address Hash('ab') in the hash table 204. Accordingly, Y is written at location Z in the hash chain 206 and Z is written at address Hash('ab') in the hash table.

As is readily apparent, the hash table 204 and hash chain 206 now relate an initial occurrence of a literal pair to one or more subsequent occurrences of that same literal pair. The value in the hash chain at position X points to position Y. Accordingly, when looking for strings beginning with the literals 'ab' pointers in the hash chain 206 that correspond to the positions of pairs giving the value Hash('ab') may be followed without having to evaluate the entire original data set. As noted above, the manner by which the hash table 204 and/or hash chain 206 are processed to compress the original data set may include any method known in the art such as the LZ algorithm.

Referring to FIG. 4, the hash function (Hash( )) serves to generate a deterministic index that is a subset of the total 64K probability that can exist for 2 bytes. For example two bytes (e.g. Byte 0 and Byte 1) of eight bits each can each represent $2^8$ possible characters and $(2^8)*(2^8)=64$ KB possible combinations of characters. The hash function creates a 13 bit hash that reduces the required search space to $2^13$ or 8K possible combinations with ⅛ the probability of the two different byte combinations. The results in the same hash value for any random two byte combination.

An example of a circuit for generating a hash value is shown in FIG. 4. As is apparent the bits 7-0 of bytes 400, 402 are input to an array of 13 XNOR gates 404. As is apparent a bit of byte 402 at position N is input to an XNOR gate with a bit at position N+3 if N+3<=7 or the bit at position N+3−7 of byte 400 if N+3>7. Likewise, each bit at position N of byte 400 is input to an XNOR gate with the bit at position N+3 for values of N up to N=4.

Figure 5:
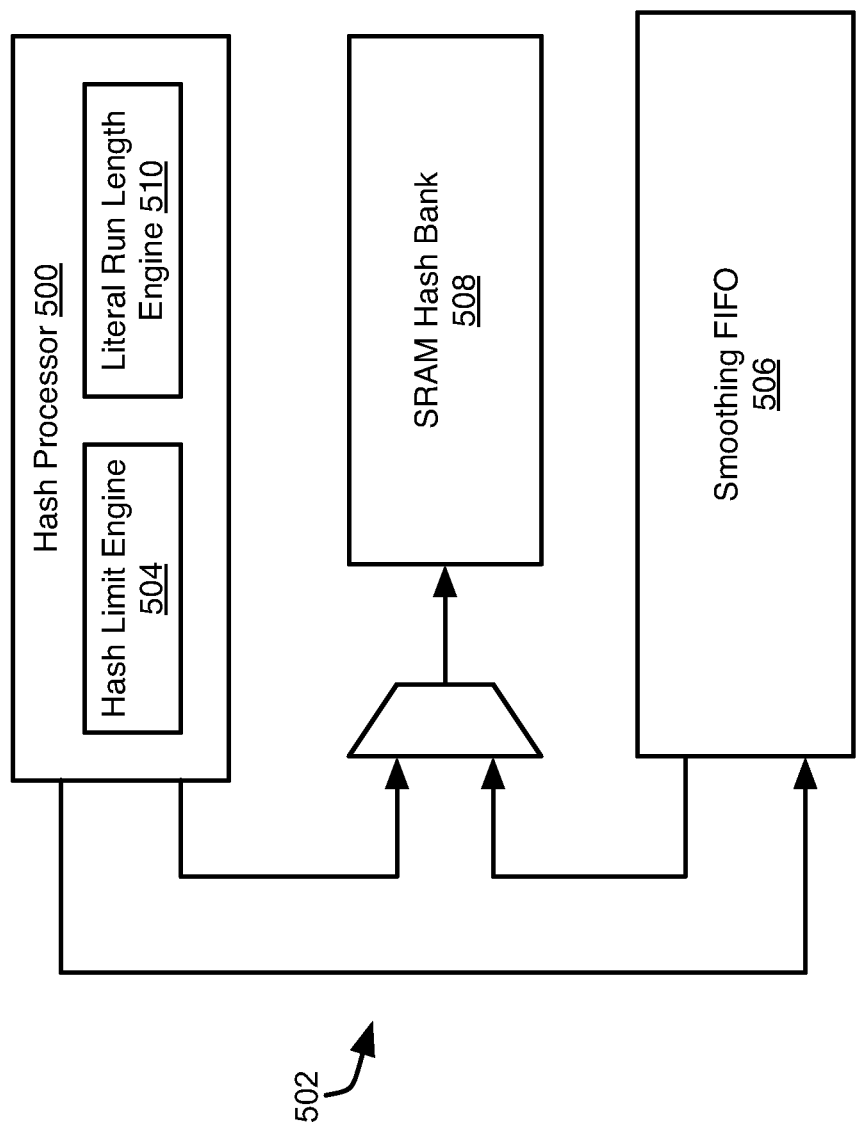
FIG. 5 is a schematic block diagram of a device for implementing hash suppression in accordance with an embodiment of the present invention.

Referring to FIG. 5, since the hashing is byte based, the challenge to process multiple hashes according to the method 300 can be met by using a hash processor with multiple memory banks allowing for multiple simultaneous writes without a large overhead in area, since single port memories can be used for the memory banks. FIFOs may be used to handle the hash collisions meaning when multiple pairs of bytes are writing to the same memory bank. When the FIFOs get filled up, the hash processor turns off the hash calculation and hash chaining operation (e.g. the method 300 of FIG. 3). Turning off hash calculation and hash chaining reduces the compression rate since new hash values are not generated and therefore cannot be indexed later for copying per the LZ algorithm.

A hash processor 500 may operate using the circuitry 500 shown in FIG. 5 to calculate the hash value for each byte pair. For example, the hash processor 500 may use a hash limit engine 504 to detect when the FIFOs 506 get full and when there is a bank collision for a write so that it can suppress the hash generation to a SRAM hash bank 508 corresponding to the full FIFO 506, thereby allowing the FIFO 506 to drain. By suppressing the hash, the hash processor 500 is capable of sustaining high throughput at a minimal cost to the compression rate. Only a negligible amount of compression is lost since a new hash value means that the data is already not very compressible. When the hash processor 500 encounters a literal that is being repeated, it uses a literal run length engine 510 to suppress hash generation for up to 16 bytes of the same literal character in order to minimize the number of hash collisions for the hash chaining which is used to generate the copy command.

In some embodiment, eight banks 508 of memory may be used along with eight FIFOs 506 to generate the hash data and smoothing functionality required to process five two byte pairs effectively generating four hash values. Each smoothing FIFO 506 may be implemented as a 16 deep FIFO for the 8 banks 508 of write memory to deal with the hash collisions when only four hashes are calculated. Any number of banks 508 of memory can be used along with any number of FIFOs 506 to generate the smoothing functionality of the hash collisions for any literal pair being hashed as long as it is more than the required number of hashes that need to be stored. For example, for applications requiring less bandwidth, two hashes can be generated using four bank 508 writes and FIFOs 506 rather than the eight in the example implementation. The smoothing FIFOs 506 may be implemented with a deeper or shallower depth than 16 before the hash processing is stopped because the FIFO 506 is full, as outlined in the method 600 of FIG. 6.

Figure 6:
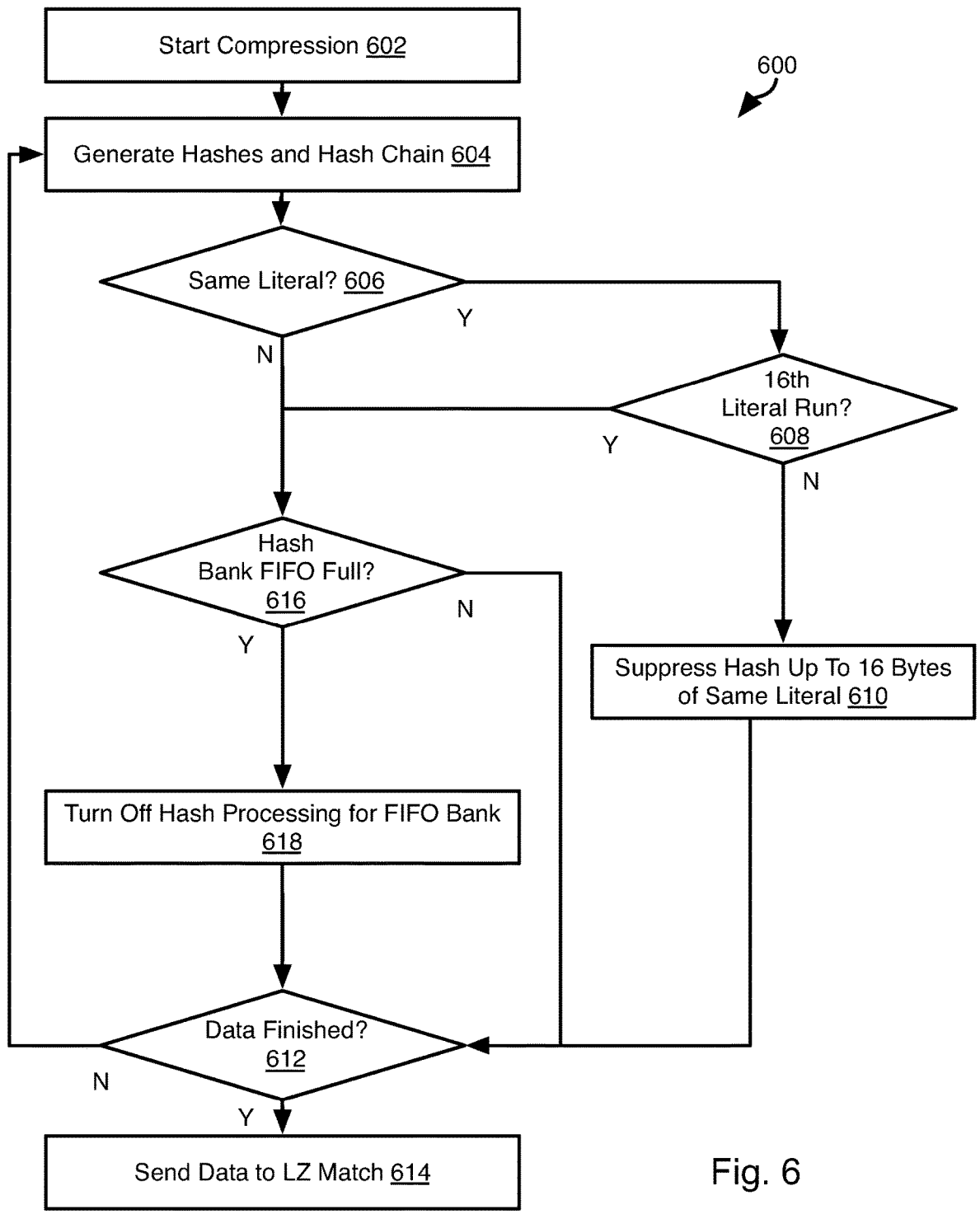
FIG. 6 is a process flow diagram of a method for hash suppression in accordance with an embodiment of the present invention.

The hash processor 500 may implement the method 600 shown in FIG. 6. For example, compression of a data file or string may start at step 602 and may include generating 604 hashes and the hash chain according to the method 300 of FIG. 3. If a same literal is found 606, i.e. a repeated literal, the method 600 may include determining whether it is the 16$^{th}$ consecutive repeated literal. If not, then generating a hash of that literal may be suppressed 610 up to the 16$^{th}$ consecutive repeated literal. If the data in the string or file is determined 612 to be finished, then the data is sent 614 to the LZ matching 514 process, which replaces literals with copy/literal commands in a command file preparatory to encoding according to Huffman coding or some other approach. Runs of repeated literals identified in the string or file as described above may be replaced with a "run length" literal that replaces repeated literals with a number of the repeated literals and an offset to the location of the first instance of the repeated literal. In some embodiments, the run length in the command file for a single character literal run, i.e. a run of repeated literals, may be constrained to always point to a multiple of a 16 character offset. In this manner, run-length copy command will provide a compression rate of more than 90 percent, which provides a good balance between compression rate and the complexity of implementing a run-length copy command.

In some embodiments, the run length hash suppression of steps 606-610 may be limited to every other character or n-multiple characters associated to a matching length window. For example, the evaluation 606 and possible suppression 610 may be performed every other character or every n characters, where n is an integer greater than two. In some embodiments, a run length command that indicates a string of repeated literals may refer to an initial instance of the repeated literal that immediately precedes the string of repeated literals or multiple literal positions offset from the string of repeated literals. Accordingly, determining that a literal is repeated at step 606 may include evaluating whether the literal is repeated at any arbitrary offset preceding the literal being processed in the current iteration of the method 600.

If more data is found 612 to remain in the file or string, then processing continues at step 604 with respect to the next literal pair in the string or file.

The method 600 may further include determining 616 whether the FIFO buffer 506 for a hash bank 508 is full. If so, then hash processing for that FIFO buffer 506 may be turned off 618 and processing continues at step 612. If not then the method may include determining 612 whether the data of the string or file is has all been processed, and if not, the generation of hashes and hash chains may continue at step 604. Otherwise, step 614 is performed for the string or file.

Figure 7:
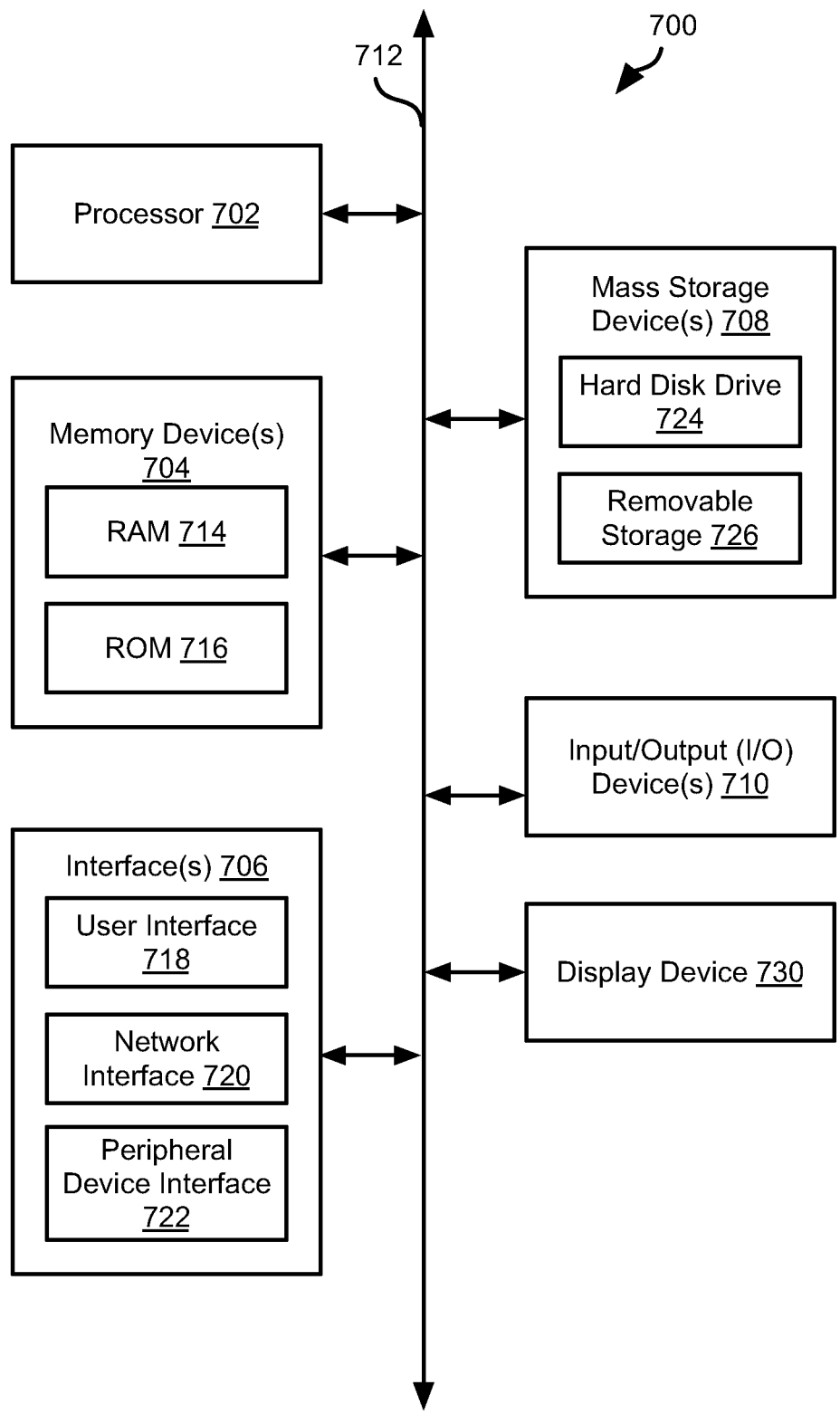
FIG. 7 is a schematic block diagram of a computer system suitable for implementing methods in accordance with embodiments of the invention.

FIG. 7 is a block diagram illustrating an example computing device 700. Computing device 700 may be used to perform various procedures, such as those discussed herein. Computing device 700 can function as a server, a client, or any other computing entity. Computing device can perform various functions as discussed herein. Computing device 700 can be any of a wide variety of computing devices, such as a desktop computer, a notebook computer, a server computer, a handheld computer, tablet computer and the like. In some embodiments, a hardware device containing circuits implementing the methods disclosed herein may be included in the computing device 700 or embedded in any of the components of the computing device listed below.

Computing device 700 includes one or more processor(s) 702, one or more memory device(s) 704, one or more interface(s) 706, one or more mass storage device(s) 708, one or more Input/Output (I/O) device(s) 710, and a display device 730 all of which are coupled to a bus 712. Processor(s) 702 include one or more processors or controllers that execute instructions stored in memory device(s) 704 and/or mass storage device(s) 708. Processor(s) 702 may also include various types of computer-readable media, such as cache memory.

Memory device(s) 704 include various computer-readable media, such as volatile memory (e.g., random access memory (RAM) 714) and/or nonvolatile memory (e.g., read-only memory (ROM) 716). Memory device(s) 704 may also include rewritable ROM, such as Flash memory.

Mass storage device(s) 708 include various computer readable media, such as magnetic tapes, magnetic disks, optical disks, solid-state memory (e.g., Flash memory), and so forth. As shown in FIG. 7, a particular mass storage device is a hard disk drive 724. Various drives may also be included in mass storage device(s) 708 to enable reading from and/or writing to the various computer readable media. Mass storage device(s) 708 include removable media 726 and/or non-removable media.

I/O device(s) 710 include various devices that allow data and/or other information to be input to or retrieved from computing device 700. Example I/O device(s) 710 include cursor control devices, keyboards, keypads, microphones, monitors or other display devices, speakers, printers, network interface cards, modems, lenses, CCDs or other image capture devices, and the like.

Display device 730 includes any type of device capable of displaying information to one or more users of computing device 700. Examples of display device 730 include a monitor, display terminal, video projection device, and the like.

Interface(s) 706 include various interfaces that allow computing device 700 to interact with other systems, devices, or computing environments. Example interface(s)

706 include any number of different network interfaces 720, such as interfaces to local area networks (LANs), wide area networks (WANs), wireless networks, and the Internet. Other interface(s) include user interface 718 and peripheral device interface 722. The interface(s) 706 may also include one or more user interface elements 718. The interface(s) 706 may also include one or more peripheral interfaces such as interfaces for printers, pointing devices (mice, track pad, etc.), keyboards, and the like.

Bus 712 allows processor(s) 702, memory device(s) 704, interface(s) 706, mass storage device(s) 708, and I/O device(s) 710 to communicate with one another, as well as other devices or components coupled to bus 712. Bus 712 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 700, and are executed by processor(s) 702. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A method comprising:
    retrieving a literal set N from an input data set at a current position with a value P;
    determining whether to suppress a generation of a hash of the literal set N;
    generating a hash value Hash(N) of the literal set N utilizing a hash function Hash( );
    looking up a value of an entry E in a hash table at an address Hash(N);
    storing the value of entry E at an address position P in a hash chain;
    writing the value P at the address Hash(N) in the hash table;
    determining whether to finish the data set or to increment the value of P to reference a next literal position in the data set; and
    compressing the input data set using the hash chain.

2. The method of claim 1, further comprising suppressing the generation of the hash of the literal set N responsive to determining that the literal set N is a repeated literal set.

3. The method of claim 2, further comprising determining not to suppress the generation of the hash of the literal set N responsive to the literal set N being a particular quantity of consecutive repeat instances of the literal set.

4. The method of claim 1, wherein writing the value P at the address Hash(N) in the hash table includes adding a write request to a FIFO buffer associated with the hash table to write the value P as the entry E at the address Hash(N) in the hash table.

5. The method of claim 1, wherein determining whether to finish the data set or to increment the value of P to reference a next literal position in the data set includes determining to finish the data set when the current position is a location of a last literal in the data set.

6. The method of claim 1, wherein determining whether to finish the data set or to increment the value of P to reference a next literal position in the data set includes determining to increment the value of P such that a value of the next literal position is P+1.

7. The method of claim 1, wherein compressing the input data set using the hash chain comprises generating copy or literal commands according to Lempel-Ziv algorithm.

8. The method of claim 7, wherein generating copy or literal commands according to the Lempel-Ziv algorithm includes replacing strings in the data set in a command set with copy and offset commands referencing identical and previously-occurring strings.

9. The method of claim 8, wherein replacing the strings in the data set in the command set with the copy and the offset commands referencing identical and previously-occurring strings includes:
    identifying an initial literal set of each of the strings;
    identifying a hash chain corresponding to the initial literal set;
    searching for one or more identical strings exclusively at positions referenced in the hash chain corresponding to the initial literal set.

10. The method of claim 8, further comprising Huffman coding the command set.

11. A method comprising:
    determining whether a literal pair N, retrieved from an input data set at a current position with a value P, is a repeated literal pair;
    determining whether the literal pair N is a particular quantity of consecutive repeated instances of the literal pair responsive to determining that the literal pair N is a repeated literal pair;
    suppressing the generation of a hash value of the literal pair responsive to determining that the literal pair N is not the particular quantity of consecutive repeated instances of the literal pair;
    determining whether a first in first out (FIFO) buffer associated with a hash table is full responsive to determining that the literal pair N is the particular quantity of consecutive repeated instances of the literal pair;
    turning off hash processing for the FIFO buffer responsive to determining that the FIFO buffer is full; and
    compressing the input data responsive to a determination that an entirety of the input data set has been processed.

12. The method of claim 11, wherein suppressing the generation of the hash value of the literal pair includes suppressing the generation of the hash value of the literal pair responsive to the determining that the literal pair N is not the sixteenth consecutive repeated literal and responsive to determining that the literal pair N is at least one character removed from a previous literal pair for which a previous hash value generation was suppressed.

13. The method of claim 11, wherein compressing the input data includes replacing strings of repeated literals in the data set with run length literal defining a number of the repeated literals and an offset to the location of the first instance of the repeated literal.

14. The method of claim 13, wherein the run length literal is constrained to a multiple of sixteen.

15. The method of claim 11, comprising generating a hash value Hash(N) of the literal set N utilizing a hash function Hash( ) responsive to determining that the literal pair N is the sixteenth consecutive repeated literal.

16. The method of claim 15, further comprising:
looking up a value of an entry E in a hash table at an address Hash(N);
storing the value of entry E at an address position P in a hash chain;
adding a write request to the FIFO buffer to write the value P at the address Hash(N) in the hash table.

17. The method of claim 11, further comprising incrementing the value of P such that a value of the next literal position in the data set is P+1 responsive determining that additional literals in the input data set have not been processed.

18. A system, comprising:
a computer readable medium; and
a processing resource configured to:
retrieve, from the computer readable medium, a literal set N from an input data set at a current position with a value P;
determine whether to suppress a generation of a hash of the literal set N based on whether the literal set N is a repeated literal;
generate a hash value Hash(N) of the literal set N;
cause storing of a value of a hash table entry E for address Hash(N) at an address position P in a hash chain;
write the value P at the address Hash(N) in the hash table;
increment the value P to a next literal position in the data set; and
output the hash chain.

19. The system of claim 18, wherein the processing resource is further configured to:
add a write request to a first out (FIFO) buffer associated with a hash table to write the value P as the entry E at the address Hash(N) in the hash table responsive to determining that the FIFO buffer is not full; and
process the request from the FIFO buffer.

20. The system of claim 18, wherein the processing resource is further configured to turn off hash processing for a first out (FIFO) buffer associated with a hash table responsive to determining that the FIFO buffer is full.

* * * * *